United States Patent
Huang et al.

(10) Patent No.: US 10,559,783 B2
(45) Date of Patent: Feb. 11, 2020

(54) DISPLAY DEVICE AND METHOD OF PRODUCING THE SAME

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Gangqi Huang, Beijing (CN); Zhaoke Zhang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/972,105

(22) Filed: May 4, 2018

(65) Prior Publication Data
US 2019/0165329 A1 May 30, 2019

(30) Foreign Application Priority Data
Nov. 27, 2017 (CN) .......................... 2017 1 1205706

(51) Int. Cl.
*H01L 51/56* (2006.01)
*H01L 51/52* (2006.01)
*H01S 5/026* (2006.01)
*H01S 5/022* (2006.01)
*H01S 5/042* (2006.01)

(52) U.S. Cl.
CPC .......... *H01L 51/56* (2013.01); *H01L 51/5246* (2013.01); *H01L 51/5259* (2013.01); *H01L 2251/568* (2013.01); *H01S 5/0261* (2013.01); *H01S 5/02288* (2013.01); *H01S 5/042* (2013.01)

(58) Field of Classification Search
None
See application file for complete search history.

(56) References Cited

U.S. PATENT DOCUMENTS

| 2013/0069105 A1* | 3/2013 | Shi ........................ H01L 51/524 257/100 |
| 2017/0133626 A1* | 5/2017 | Senoo ................. H01L 51/5203 |

FOREIGN PATENT DOCUMENTS

| CN | 101794866 A | 8/2010 |
| CN | 202067839 U | 12/2011 |
| CN | 203134869 U | 8/2013 |
| CN | 103325958 A | 9/2013 |
| CN | 203300706 U | 11/2013 |

(Continued)

OTHER PUBLICATIONS

First Chinese Office Action dated Mar. 4, 2019, received for corresponding Chinese Application No. 201711205706.1.

*Primary Examiner* — Zandra V Smith
*Assistant Examiner* — Lawrence C Tynes, Jr.
(74) *Attorney, Agent, or Firm* — Kinney & Lange, P.A.

(57) ABSTRACT

The present disclosure relates to a display device and a method of producing the same. In an embodiment, the display device includes: a base substrate; a cover plate opposite to the base substrate; and a first frame sealant, the cover plate is bonded to the base substrate at least by the first frame sealant, at least one groove is provided in a bonding region of at least one of the base substrate and the cover plate, and at least a part of the first frame sealant is disposed in the groove.

14 Claims, 5 Drawing Sheets

(56) References Cited

FOREIGN PATENT DOCUMENTS

| CN | 206497906 U | 9/2017 |
|---|---|---|
| CN | 107293648 A | 10/2017 |
| CN | 107359271 A | 11/2017 |

* cited by examiner

DISPLAY DEVICE AND METHOD OF PRODUCING THE SAME

CROSS-REFERENCE TO RELATED APPLICATION

This application claims priority to Chinese Patent Application No. 201711205706.1 filed on Nov. 27, 2017 in the State Intellectual Property Office of China, the disclosure of which is hereby incorporated by reference in its entirety.

TECHNICAL FIELD

The present disclosure relates to the field of display technology, and particularly to a display device and a method of producing the same.

BACKGROUND

In the traditional flat panel display technology, a display device is generally formed by bonding a base substrate and a cover plate with a frame sealant. The display device may be exposed to an environment of water and/or oxygen in daily applications. If the display device does not have a good sealing performance, display elements in the display device may be exposed to moisture and/or oxygen, and thus may be damaged.

SUMMARY

According to an aspect of the present disclosure, there is provided a display device, the display device comprises: a base substrate; a cover plate opposite to the base substrate; and a first frame sealant, the cover plate is bonded to the base substrate at least by the first frame sealant, at least one groove is provided in a bonding region of at least one of the base substrate and the cover plate, and at least a part of the first frame sealant is disposed in the groove.

In some embodiments, a first desiccant layer is disposed in the groove.

In some embodiments, at least one thermosensitive laser circuit is disposed in the groove, the thermosensitive laser circuit emitting a laser for melting an inner wall of the groove when an ambient temperature exceeds a preset value.

In some embodiments, the thermosensitive laser circuit comprises a power supply, a thermistor and a laser device connected in series, and a resistance of the thermistor is decreased in a stepwise manner when the ambient temperature exceeds the preset value.

In some embodiments, at least one of the base substrate and the cover plate is provided with at least one protrusion facing and aligned with the groove.

In some embodiments, the display device further comprises: a display region and a peripheral region surrounding the display region, the bonding region is located in the peripheral region, and both the groove and the first frame sealant are disposed around the display region.

In some embodiments, the groove is continuously or discontinuously arranged in a ring around the display region.

In some embodiments, the display device further comprises at least one second frame sealant around the display region.

In some embodiments, the second frame sealant is disposed between the display region and the first frame sealant.

In some embodiments, the display device further comprises at least one organic light-emitting diode, the organic light-emitting diode is arranged on a surface of the base substrate facing the cover plate.

In some embodiments, the display device further comprises a second desiccant layer on a surface of the cover plate facing the base substrate.

According to another aspect of the present disclosure, there is provided a method of producing a display device, the method comprises steps of: forming at least one groove in a bonding region of at least one of a base substrate and a cover plate of the display device; forming a first frame sealant on the bonding region and in the groove; and aligning and bonding the base substrate with the cover plate.

In some embodiments, after the step of forming the at least one groove and before the step of forming the first frame sealant, the method further comprises: forming a first desiccant layer in the groove.

In some embodiments, after the step of forming the at least one groove and before the step of forming the first frame sealant, the method further comprises: forming at least one thermosensitive laser circuit in the groove, the thermosensitive laser circuit emits a laser for melting the inner wall of the groove when an ambient temperature exceeds a preset value.

In some embodiments, before the step of aligning and bonding the base substrate with the cover plate, the method further comprises: forming at least one protrusion on at least one of the base substrate and the cover plate so that the protrusion and the groove face each other and are aligned with each other when the base substrate and the cover plate are aligned with each other.

In some embodiments, the display device further comprises a display region and a peripheral region surrounding the display region, the bonding region is located in the peripheral region, both the groove and the first frame sealant are disposed around the display region, and before the step of aligning and bonding the base substrate with the cover plate, the method further comprises: forming at least a second frame sealant on the bonding region of at least one of the base substrate and the cover plate so that the second frame sealant surrounds the display region after the base substrate and the cover plate are bonded.

BRIEF DESCRIPTION OF THE DRAWINGS

Other features, purposes, and advantages of the present disclosure will become more apparent by reading the following detailed description of non-limiting embodiments with reference to the following drawings.

DETAILED DESCRIPTION

Figure 1:
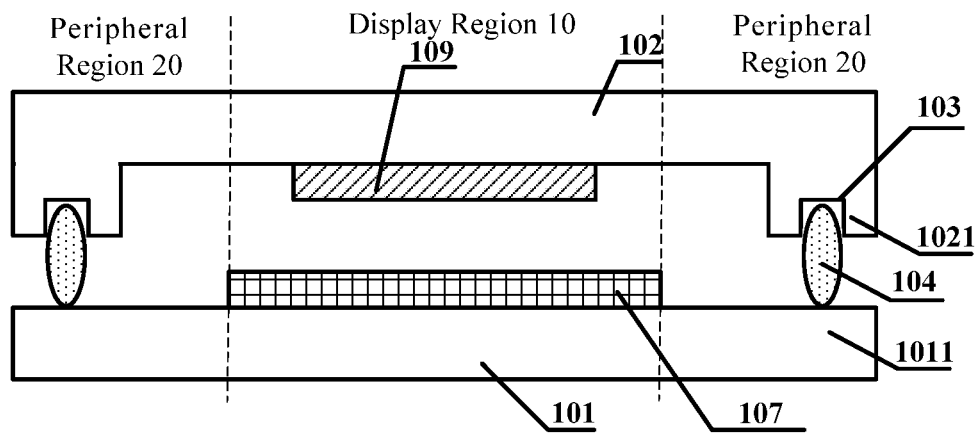
FIG. 1 is a schematic view of an OLED display device according to an embodiment of the present disclosure.

The present disclosure will be further described in detail below with reference to the accompanying drawings and embodiments. It will be understood that the specific embodiments described herein are merely used to explain the present invention and not to limit the present invention. In addition, it should also be noted that, for ease of description, only the parts related to the invention are shown in the drawings.

It should be noted that the embodiments and the features in the embodiments in the present disclosure can be combined with each other without conflict. The present disclosure will be described in detail below with reference to the accompanying drawings and embodiments.

An embodiment of the present disclosure provides a display device, such as an OLED (Organic Light Emitting Diode) display device, an LCD (Liquid Crystal Display) display device, a QLED (Quantum Dot Light Emitting Diode) display device, and the like. The display device includes a base substrate and a cover plate face-to-face aligned with and bonded to the base substrate. The cover plate is bonded to the base substrate by a frame sealant, and a bonding region of at least one of the base substrate and the cover plate is provided with at least one groove. At least a part of the frame sealant is disposed in the groove. In this way, a contact area between the frame sealant and at least one of the base substrate and the cover plate is increased, thereby increasing an adhesive force between the sealant and the base substrate and/or the cover plate, and improving a sealing performance of the display device, and effectively preventing moisture or oxygen from entering the display device.

Hereinafter, the present disclosure will be described taking an OLED display device as an example.

Compared with a LCD display device, the OLED display device has a series of advantages such as a simple producing process, low power consumption, high luminous efficiency, high color gamut, fast response time, thinness and lightness, and the like, and it is an important technology in the display field.

An OLED includes an organic light emitting layer, a cathode, an anode, an electron injection layer, an electron transport layer, a hole injection layer a hole transport layer, etc.

The display principle of the OLED is as follows, mainly including:

injection of carriers under action of an external electric field: electrons and holes are injected from the cathode and the anode to organic functional layers between the cathode and the anode, respectively;

transport of carriers: the injected electrons and holes moves from the electron transport layer and the hole transport layer to the organic light emitting layer, respectively;

recombination of carriers: electrons and holes are combined to generate excitons;

excitons migration: excitons migrate under action of external electric field, transfer energy to luminescent molecules, and excite the electrons to jump from a ground state to an excited state;

electroluminescence: excited state excitons generate photons through radiative transitions.

The applicant has found that the OLED display device are prone to be affected by an external environment, resulting in a performance degradation of the OLED display device and the like, as well as a short lifetime of blue light materials. Therefore, sealed bonding plays a crucial role in the performance of the OLED display device.

FIG. 1 is a schematic view of an OLED display device according to an embodiment of the present disclosure. Referring to FIG. 1, an OLED display device provided in an embodiment of the present disclosure includes: a base substrate 101, such as a glass substrate, and a cover plate 102, such as a glass cover plate. The base substrate 101 and the cover plate 102 are bonded to each other by a frame sealant to form an OLED display device. The OLED display device includes a display region 10 and a peripheral region 20 surrounding the display region. A bonding region 1011 of the base substrate 101 and a bonding region 1021 of the cover plate 102, which are connected with each other by the frame sealant, are located in the peripheral region 20. OLED display elements 107 are provided on a surface of the base substrate 101 facing the cover plate 102. The OLED display elements 107 include an organic light emitting layer, a cathode, an anode, an electron transport layer, a hole transport layer, and the like. A second desiccant layer 109 is disposed on a surface of the cover plate 102 facing the base substrate 101. The OLED display elements 107 and the second desiccant layer 109 are disposed opposite to each other and both located in the display region 10.

As shown in FIG. 1, the bonding region 1021 of the cover plate 102 is provided with at least one groove 103. The groove 103 is filled with a first frame sealant 104. The cover plate 102 is bonded to the base substrate 101 by at least the first frame sealant 104.

Since the groove 103 is provided in the bonding region 1021 where the first frame sealant 104 is adhered to the cover plate 102, a contact area between the first frame sealant 104 and the cover plate 102 is increased, and the adhesive force between the first frame sealant 104 and the cover plate 102 is enhanced, thereby increasing a sealing performance of the OLED display device.

Figure 2:
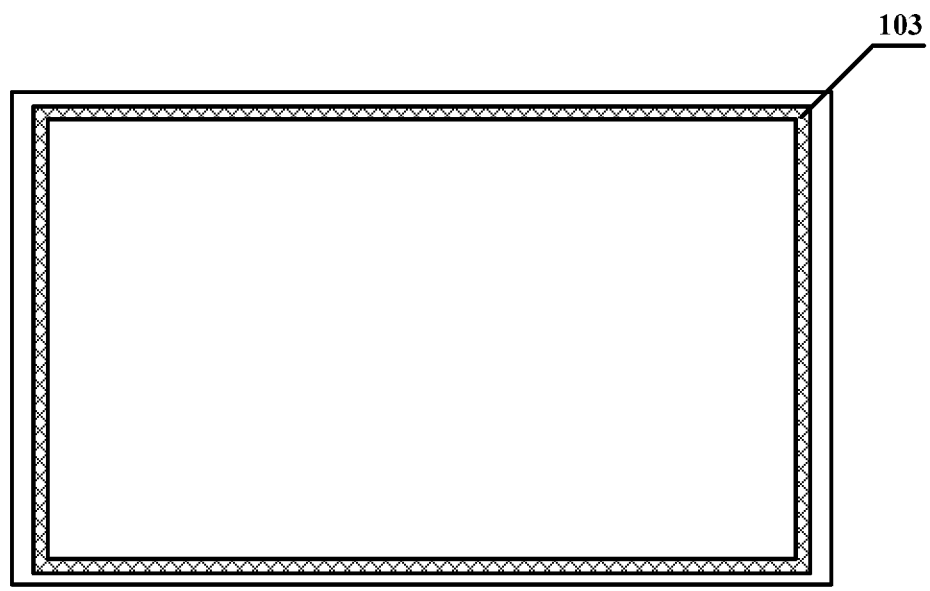
FIG. 2 is a schematic plan view of a cover plate according to an embodiment of the present disclosure.

FIG. 2 is a schematic plan view of a cover plate according to an embodiment of the present disclosure. As shown in FIG. 2 in view of FIG. 1, the groove 103 on the cover plate 102 is continuously arranged around the display region 10, and it is disposed in a shape of a ring, for example, in a shape of a rectangular ring.

Figure 3:
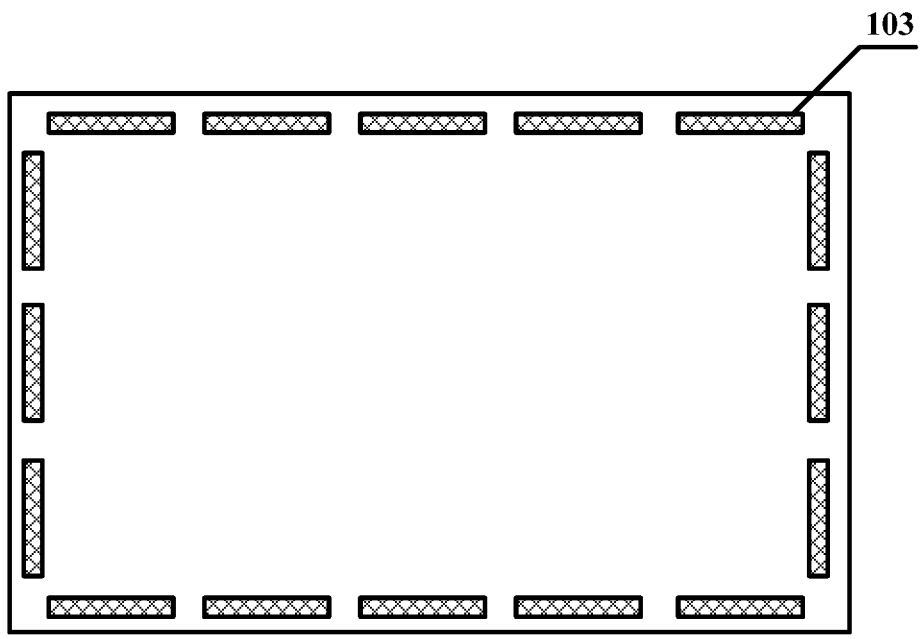
FIG. 3 is a schematic plan view of a cover plate according to another embodiment of the present disclosure.

FIG. 3 is a schematic plan view of a cover plate according to another embodiment of the present disclosure. With reference to FIG. 3 and FIG. 1, the groove 103 on the cover plate 102 is discontinuously arranged around the display region 10, and it is disposed in a shape of a ring, for example, in a shape of a rectangular ring. The groove 103 may include a plurality of sub grooves, and the plurality of sub grooves are separated from each other by a preset distance.

The cover plate in FIG. 2 or FIG. 3 can be selected according to the producing processes and practical requirements. Alternatively, based on actual needs and experiences of technicians, the groove 103 may be provided at specific positions where sealing defects easily occur.

Although a cross section of the groove 103 shown in FIG. 1 is rectangular, a person skilled in the art can understand that the cross section of the groove 103 may also be in a shape selected from shapes such as a trapezoid, a triangle, an arc, or the like.

When the groove 103 is provided at specific positions, or when the sub grooves are separated from each other by the preset distance, the groove 103 or the sub grooves may be in a shape of a rectangle as shown in FIG. 3, and may also be a shape of a circle or an ellipse. Those skilled in the art can flexibly choose the shape according to the producing processes and the actual needs.

The depth of the groove 103 or the sub grooves can be set according to actual situations, for example, the depth can be set to 1~9 mm. If the groove or each sub groove is in the shape of the rectangle, its width and length are also set according to the actual conditions such as a size of the bonding region, for example, the width can be set to 1~9 mm, and the length can be set to 1~900 mm. Specifications of oval and/or circular grooves can also be set similarly.

Figure 4:
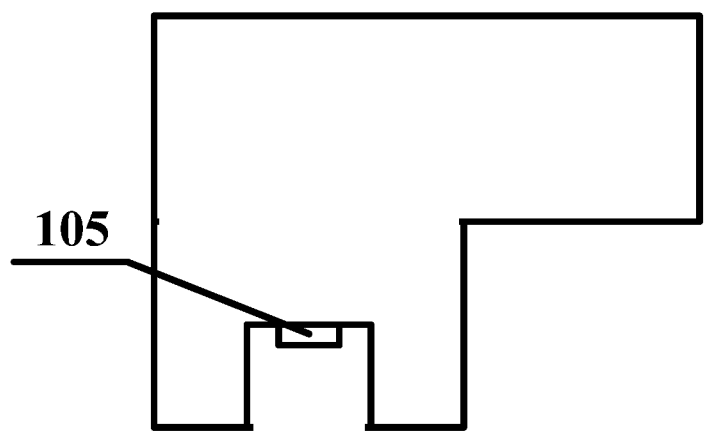
FIG. 4 is a schematic sectional view of a groove, in which a desiccant layer is provided, according to an embodiment of the present disclosure.

FIG. 4 is a sectional schematic structural view of a groove, in which a desiccant layer is provided, according to an embodiment of the present disclosure. As shown in FIG. 4, a first desiccant layer 105 is disposed in the groove 103. The first desiccant layer 105 can absorb the moisture inside the display device as well as the moisture and oxygen from an external environment. The first desiccant layer 105 and the second desiccant layer 109 may be formed simultaneously in the same process step, or they may be formed in different process steps.

Figure 5:
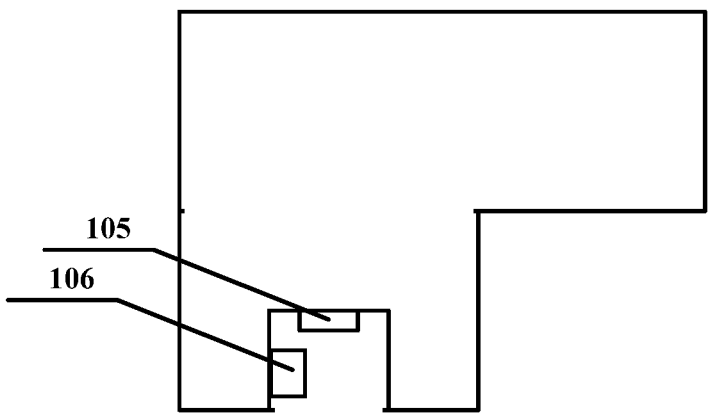
FIG. 5 is a schematic sectional view of a groove, in which a thermosensitive laser circuit is provided, according to an embodiment of the present disclosure.

FIG. 5 is a schematic sectional view of a groove, in which a thermosensitive laser circuit is provided, according to an embodiment of the present disclosure. As shown in FIG. 5, at least one thermosensitive laser circuit 106 is provided in the groove 103. The thermosensitive laser circuit 106 emits a laser for melting an inner wall of the groove 103 when an ambient temperature exceeds a preset value.

Figure 6:
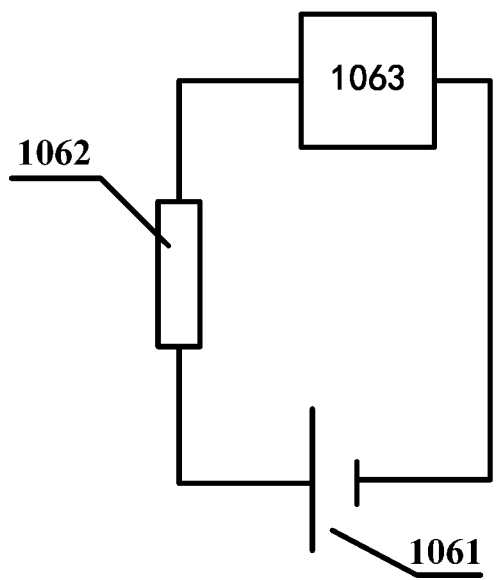
FIG. 6 is a schematic view of the thermosensitive laser circuit in FIG. 5.

Specifically, FIG. 6 is a schematic view of the thermosensitive laser circuit according to an embodiment of the present disclosure. As shown in FIG. 6, the thermosensitive laser circuit 106 may specifically include a power supply 1061, a thermistor 1062 and a laser device 1063 connected in series. A resistance of the thermistor 1062 is decreased in a stepwise manner when the ambient temperature exceeds the preset value.

Since the first desiccant layer 105 in the groove 103 may generate heat due to water absorption, a change in the environment temperature causes a change in a resistance value of the thermistor 1062 in the thermosensitive laser circuit 106 so that the thermosensitive laser circuit 106 is turned on. The laser device 1063 in the thermosensitive laser circuit 106 is activated to emit a laser, and the laser melts the inner wall of the groove 103 in the cover plate 102, thereby greatly increasing the adhesive force between the cover plate and the frame sealant, and enhancing the sealing performance of the OLED display device.

When the groove 103 is formed as an annular groove 103 as shown in FIG. 2 or a rectangular sub groove with a long side, several thermosensitive laser circuits 106 may be disposed in one groove or sub groove at intervals, for example, 3 mm to 20 mm. The smaller the intervals are, the better the sealing performance of the OLED display device is.

In the thermosensitive laser circuit 106, the power source 1061 is, for example, a direct current power source. Alternatively, a power source for the OLED can be used.

The thermistor 1062 is a negative temperature thermistor, namely, a resistance of the thermistor 1062 is decreased exponentially with increasing temperature. A triggering condition of the thermistor means that when the temperature rises to a certain temperature, the thermosensitive laser circuit generates a triggering current, that is, the resistance of the thermistor is decreased in a stepwise manner. Since the first desiccant layer 105 in the groove 103 may generate heat due to water absorption, the change in the environment temperature causes the change in the resistance value of the thermistor 1062 in the thermosensitive laser circuit 106, and the thermosensitive laser circuit 106 is turned on. The laser device 1063 in the thermosensitive laser circuit 106 is activated to emit the laser, and the laser melts the inner wall of the groove 103 in the cover plate 102, thereby greatly increasing the adhesive force between the cover plate and the frame sealant, and enhancing the sealing performance of the OLED display device.

The laser device 1063 is, for example, a general semiconductor laser device or a CO2 (carbon dioxide) laser device. The semiconductor laser device uses a certain semiconductor material as a working substance to generate a stimulated emission. A working principle of the semiconductor laser device is to excite non-equilibrium carriers between energy bands of a semiconductor material or between an energy band and an impurity energy level by a certain excitation method (electric injection, optical pump or high-energy electron beam injection) to achieve population inversion, resulting in stimulated light emission. The semiconductor laser device mainly includes a laser diode, a driving circuit and a collimating lens (a collimating lens is generally a plano-convex lens). The laser diode is attached to the inner wall of the groove. If a laser beam is generated by the laser diode, the laser beam could be directed to the inner wall of the groove through the collimating lens. At the same time, the laser device and the thermistor are connected in series to form the thermosensitive laser circuit. Since the resistance of thermistor is changed when the temperature changes, the laser device starts to work, so that the inner wall, made of glass, of the groove is melted, thereby obtaining a good sealing performance of the OLED display device.

Since an area irradiated by the laser is far away from the display region 10, there is no influence on a display effect. After the desiccant layer releases heat, the temperature will not rise any more, therefore the laser device will not continue to irradiate the glass with a strong laser, not resulting in continuous softening of the glass. At the same time, the glass is thick and less affected.

Figure 7:
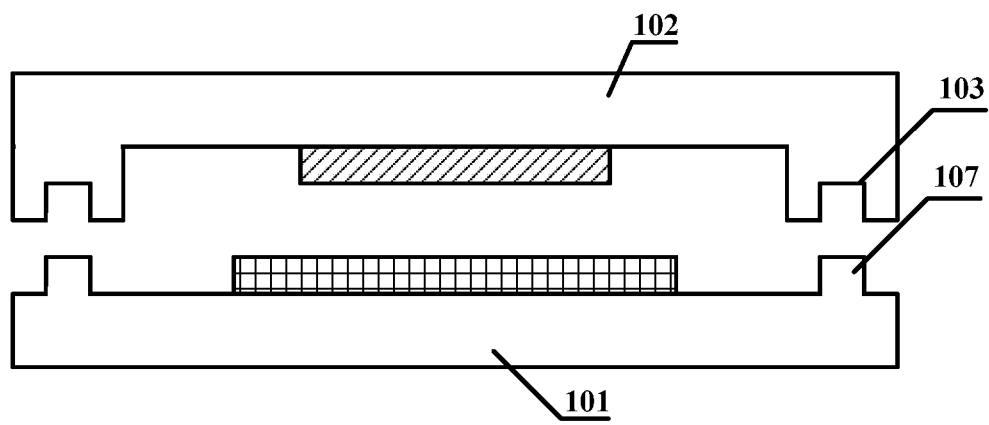
FIG. 7 is a schematic view of an OLED display device according to another embodiment of the present disclosure.

FIG. 7 is a schematic view of an OLED display device according to another embodiment of the present disclosure. As shown in FIG. 7, compared with the OLED display device shown in FIG. 1, the base substrate 101 is further provided with a protrusion 107 aligned with the groove 103.

In general, a height of the protrusion 107 is smaller than a depth of the groove 103. When the first desiccant layer 105 and the thermosensitive laser circuit 106 are disposed in the groove 103, a difference between the depth of the groove 103 and the height of the protrusion 107 may be sufficient to accommodate the first desiccant layer 105 and the thermosensitive laser circuit 106. In the OLED display device, at least a part of the protrusion 107 is accommodated in the groove 103.

Figure 8:
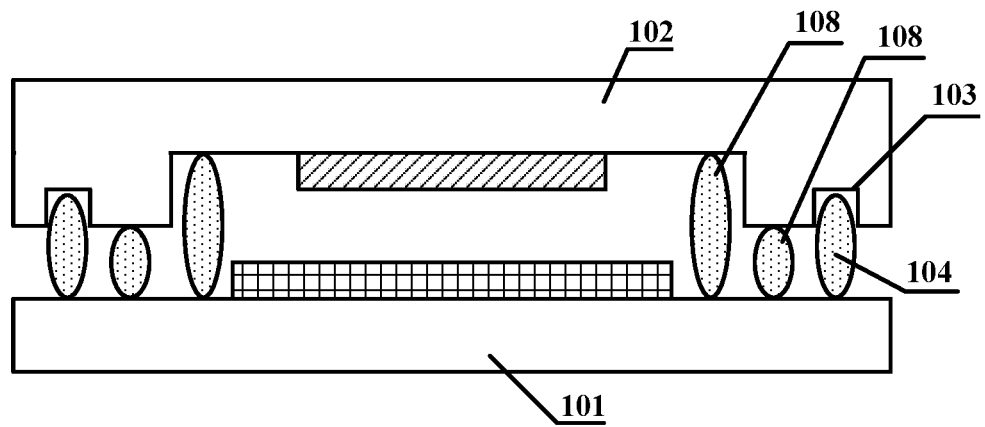
FIG. 8 is a schematic view of an OLED display device with an additional frame sealant according to yet another embodiment of the present disclosure.

FIG. 8 is a schematic view of an OLED display device with an additional frame sealant according to yet another embodiment of the present disclosure. Compared with the OLED display device structure shown in FIG. 1, in order to further improve the sealing performance, as shown in FIG. 8, the OLED display device further includes at least one second frame sealant 108. The second frame sealant 108 is also disposed around the display region 10, for example, the second frame sealant 108 is continuously or discontinuously arranged around the display region 10.

In an embodiment, as shown in FIG. 8, the second frame sealant 108 is disposed between the first frame sealant 104 and the display region 10. In another embodiment, the second frame sealant 108 is disposed on a side of the first frame sealant 104 away from the display region 10. In a further embodiment, the second frame sealant 108 may be provided on both the locations above-mentioned.

In an embodiment, a region of the cover plate 102 coated with the second frame sealant 108 may also be provided with the groove.

In an embodiment, a desiccant may be added to both the first frame sealant and the second frame sealant to protect the OLED elements better.

Although the groove 103 is formed on the cover plate 102 in the above embodiments, those skilled in the art can understand that, in other embodiments, the groove 103 can be formed on the base substrate 101, or formed on both the cover plate 102 and the base substrate 101. Correspondingly, the protrusion 107 may be formed on the at least one of the cover plate 102 and the base substrate 101, for example, on the cover plate or on both the cover plate and the base substrate.

Figure 9:
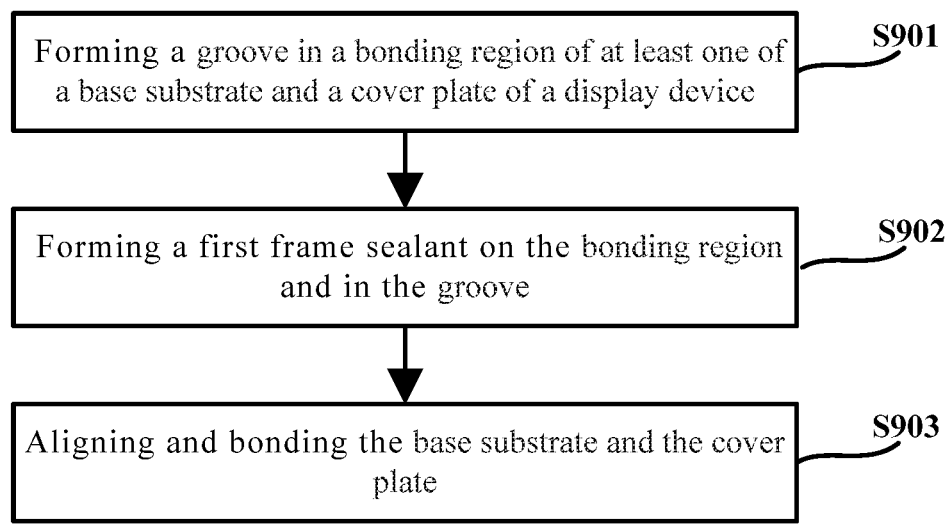
FIG. 9 is a flow chart of a method of producing an OLED display device according to an embodiment of the present disclosure.

An embodiment of the present disclosure provides a method for producing an OLED display device. FIG. 9 is a flow chart of a method of producing an OLED display device according to an embodiment of the present disclosure. As shown in FIG. 9, the method includes the following steps S901-S903.

In the step S901, a groove is formed in a bonding region of at least one of a base substrate and a cover plate of a display device.

The groove is formed around a display region 10, for example, the groove is continuously or discontinuously arranged around the display region 10 and in a shape of a ring.

In the step S902, a first frame sealant is formed in the bonding region and in the groove.

In the step S903, the base substrate is align with and bond with the cover plate.

Through the method, a contact area between the first frame sealant 104 and the cover plate 102 is increased, and the adhesive force between the first frame sealant 104 and the cover plate 102 is enhanced, thereby increasing a sealing performance of the OLED display device.

When the groove is formed in step S901, the groove can be produced by photolithography or the like, for example, by the following steps: using a semiconductor micromachining process comprising: coating a positive photoresist on a glass substrate, developing with a mask and etching the glass substrate with an etching solution (such as HF+NH4F+H2O) to form the groove.

Further, in an embodiment, after the step of forming the groove and before the step of forming the first frame sealant, the method further includes: forming a first desiccant layer in the groove.

The first desiccant layer can absorb the moisture inside the display device as well as the moisture and oxygen from an external environment. The first desiccant layer and the second desiccant layer may be formed simultaneously in the same process step, or they may be formed in different process steps.

Further, in an embodiment, after the step of forming the groove and before the step of forming the first frame sealant, the method further includes: forming at least one thermosensitive laser circuit in the groove. The thermosensitive laser circuit emits a laser for melting the inner wall of the groove when an ambient temperature exceeds a preset value, so that the adhesive force between the cover plate and the frame sealant may be greatly increased, and a sealing performance of the OLED display device is enhanced.

Further, in an embodiment, before the step of aligning and bonding the base substrate with the cover plate, the method further includes: forming at least one protrusion on at least one of the base substrate and the cover plate so that the protrusion and the groove face each other and are aligned with each other when the base substrate and the cover plate are aligned with each other.

Further, in an embodiment, before the step of aligning and bonding the base substrate with the cover plate, the method further includes: forming at least one second frame sealant in the bonding region of at least one of the base substrate and the cover plate so that the second frame sealant is disposed around the display region after the base substrate and the cover plate are bonded.

The second frame sealant may be disposed between the first frame sealant and the display region, or on a side of the first frame sealant away from the display region, or on both the locations above-mentioned.

It should be noted that although the steps of the method in the present disclosure is described in a particular order in the drawings, it does not require or imply that these steps must be performed in that particular order, or that all illustrated steps must be performed to achieve the desired result. Moreover, the steps depicted in the flow chart can change the order of execution. Additionally or alternatively, some steps may be omitted, multiple steps may be combined into one step, and/or one step may be broken down into multiple steps.

The above description is merely some embodiments of the present disclosure and descriptions of applied technical principles. Those skilled in the art should understand that the scope of the present disclosure is not limited to technical solutions of the specific combination of the above technical features, but should also cover other technical solutions formed by any combination of the above technical features or equivalent features without departing from the inventive concept. For example, technical solutions formed by replacing technical features of the present disclosure with technical features having similar functions to the technical features of the present disclosure.

What is claimed is:

1. A display device, comprising:
a base substrate;
a cover plate opposite to the base substrate; and
a first frame sealant;
wherein the cover plate is bonded to the base substrate at least by the first frame sealant, at least one groove is provided in a bonding region of at least one of the base substrate and the cover plate, and at least a part of the first frame sealant is disposed in the groove,
wherein at least one thermosensitive laser circuit is disposed in the groove, the thermosensitive laser circuit configured to emit a laser for melting an inner wall of the groove when an ambient temperature exceeds a preset value.

2. The display device of claim 1, wherein a first desiccant layer is disposed in the groove.

3. The display device of claim 1, wherein the thermosensitive laser circuit comprises a power supply, a thermistor and a laser device connected in series, and a resistance of the thermistor is decreased in a stepwise manner when the ambient temperature exceeds the preset value.

4. The display device of claim 1, wherein at least one of the base substrate and the cover plate is provided with at least one protrusion facing and aligned with the groove.

5. The display device of claim 1, further comprising:
a display region and a peripheral region surrounding the display region,
wherein the bonding region is located in the peripheral region, and both the groove and the first frame sealant are disposed around the display region.

6. The display device of claim 5, wherein the groove is continuously or discontinuously arranged in a ring around the display region.

7. The display device of claim 5, further comprising at least one second frame sealant around the display region.

8. The display device of claim 7, wherein the second frame sealant is disposed between the display region and the first frame sealant.

9. The display device of claim 1, further comprising at least one organic light-emitting diode,
wherein the organic light-emitting diode is arranged on a surface of the base substrate facing the cover plate.

10. The display device of claim 9, further comprising a second desiccant layer on a surface of the cover plate facing the base substrate.

11. A method of producing a display device, comprising steps of:
forming at least one groove in a bonding region of at least one of a base substrate and a cover plate of the display device;
forming a first frame sealant on the bonding region and in the groove; and
aligning and bonding the base substrate with the cover plate,
wherein after the step of forming the at least one groove and before the step of forming the first frame sealant, the method further comprises:
forming at least one thermosensitive laser circuit in the groove,
wherein the thermosensitive laser circuit emits a laser for melting the inner wall of the groove when an ambient temperature exceeds a preset value.

12. The method of claim 11, wherein after the step of forming the at least one groove and before the step of forming the first frame sealant, the method further comprises:
forming a first desiccant layer in the groove.

13. The method of claim 11, wherein before the step of aligning and bonding the base substrate with the cover plate, the method further comprises:
forming at least one protrusion on at least one of the base substrate and the cover plate so that the protrusion and the groove face each other and are aligned with each other when the base substrate and the cover plate are aligned with each other.

14. The method of claim 11, wherein the display device further comprises a display region and a peripheral region surrounding the display region, the bonding region is located in the peripheral region, both the groove and the first frame sealant are disposed around the display region, and
wherein before the step of aligning and bonding the base substrate with the cover plate, the method further comprises:
forming at least a second frame sealant on the bonding region of at least one of the base substrate and the cover plate so that the second frame sealant surrounds the display region after the base substrate and the cover plate are bonded.

* * * * *